United States Patent [19]

Schupbach

[11] Patent Number: 4,572,325

[45] Date of Patent: Feb. 25, 1986

[54] STEREOPHONIC BAFFLE

[76] Inventor: Walter Schupbach, 4, route de Benex, 1197 Prangins, Switzerland

[21] Appl. No.: 546,195

[22] Filed: Oct. 27, 1983

[30] Foreign Application Priority Data

Dec. 23, 1982 [CH] Switzerland ........................ 7517/82

[51] Int. Cl.[4] ............................................... H05K 5/00

[52] U.S. Cl. ..................................... 181/145; 181/199

[58] Field of Search ............... 181/144, 145, 146, 147, 181/199

[56] References Cited

U.S. PATENT DOCUMENTS 3,582,553 6/1971 Bose .

3,637,039 1/1972 Raichel et al. .

3,933,219 1/1976 Butler .

FOREIGN PATENT DOCUMENTS 2188387 1/1974 France .

2407635 5/1979 France .

*Primary Examiner*—L. T. Hix

*Assistant Examiner*—Brian W. Brown

*Attorney, Agent, or Firm*—Young & Thompson

[57] ABSTRACT

The stereophonic single baffle comprises two adjacent chambers (7, 8) comprising each a rear wall (9, 10) forming an angle between them. Loud speakers (13 to 16) are mounted on each of said rear walls (9,10). The center of the loud speakers (13 to 16) mounted on a same rear wall (9,10) are located on a line diverging simultaneously from the bottom of the baffle and from the middle partition (6) of the baffle separating the two chambers (7, 8).

12 Claims, 5 Drawing Figures

STEREOPHONIC BAFFLE

There are numerous means for the stereophonic restitution of sounds the more common ones being the devices with two baffles, each comprising one or several loud-speakers fed by "left" respectively "right" signals delivered by an amplifier. The drawback of these systems resides in the fact that it is generally necessary to modify, by means of appropriate filters for example, the "left" and "rigth" signals as a function of the loud-speakers used in each baffle. Thereby all the loud-speakers of a same baffle do not receive the same signals and problems relating to displacement of phase can occur. Further, the positioning of the baffles with respect to each other and with respect to the hearing room is critical and poor restitution frequently results from the positioning of the baffles.

To remedy this drawback there have been proposed stereophonic baffles grouping the two channels, left and right, in only one single baffle such as for example the Jensen S-100 baffle. These baffles use three loud-speakers directed toward the hearing room along three diverging directions, the central loud-speaker being fed by the sum of the "left" and "right" signals (L+R), the left side loud-speaker being fed by the differential signal (L+R) and the right side loud-speaker being fed by an inverse differential signal—(R−L). The drawback of these baffles is that for each channel there is needed a special transformer comprising insulated secondaries rendering impossible their use with common amplifiers. Furthermore it has been shown that the stereophonic effect of these baffles is either unstable or imperfect and that the hearing position with respect to the baffle is very critical.

The present invention has the aim of realising a single baffle for the restitution of stereophonic sounds the loud-speakers of which can be fed directly with the "left" respectively "right" signals on an amplifier, permitting the realisation of a stable and perfect stereophonic effect and with which the listening person has not to be located at a precise hearing position.

The attached drawings schematically and by way of example one embodiment of the stereophonic baffle according to the invention.

Figure 1:
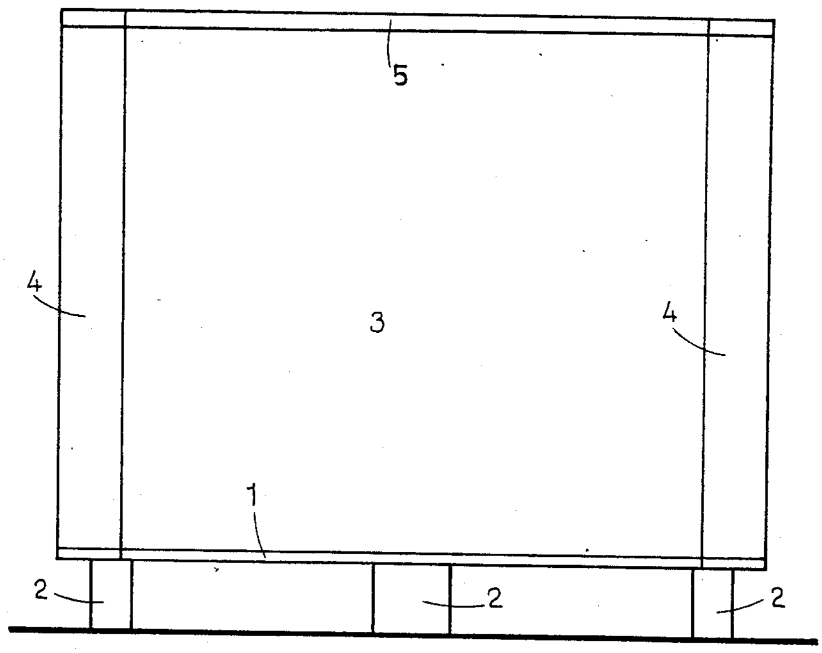
FIG. 1 is an elevation of the baffle seen from the hearing room.
Figure 2:
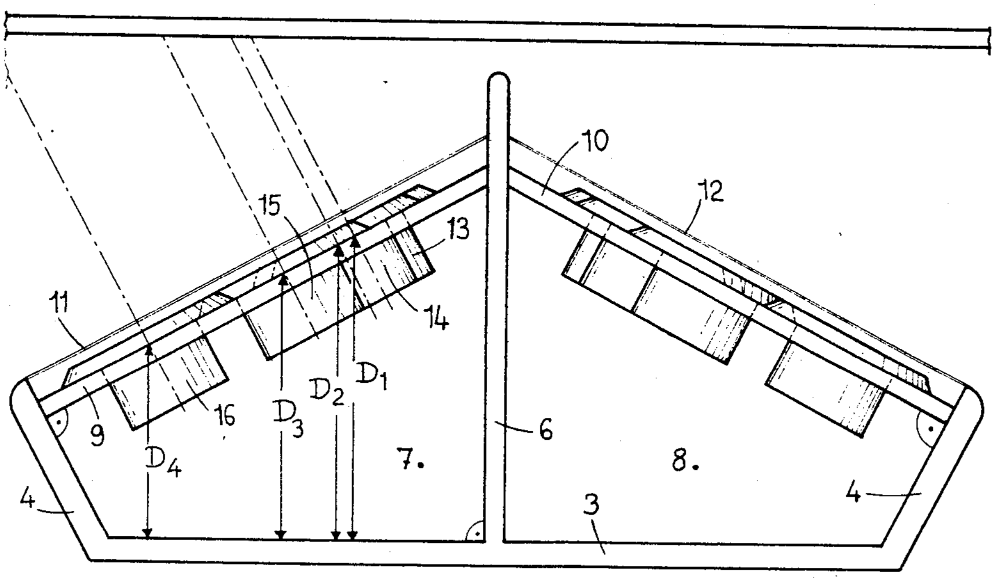
FIG. 2 is a top view of the baffle shown in FIG. 1.
Figure 3:
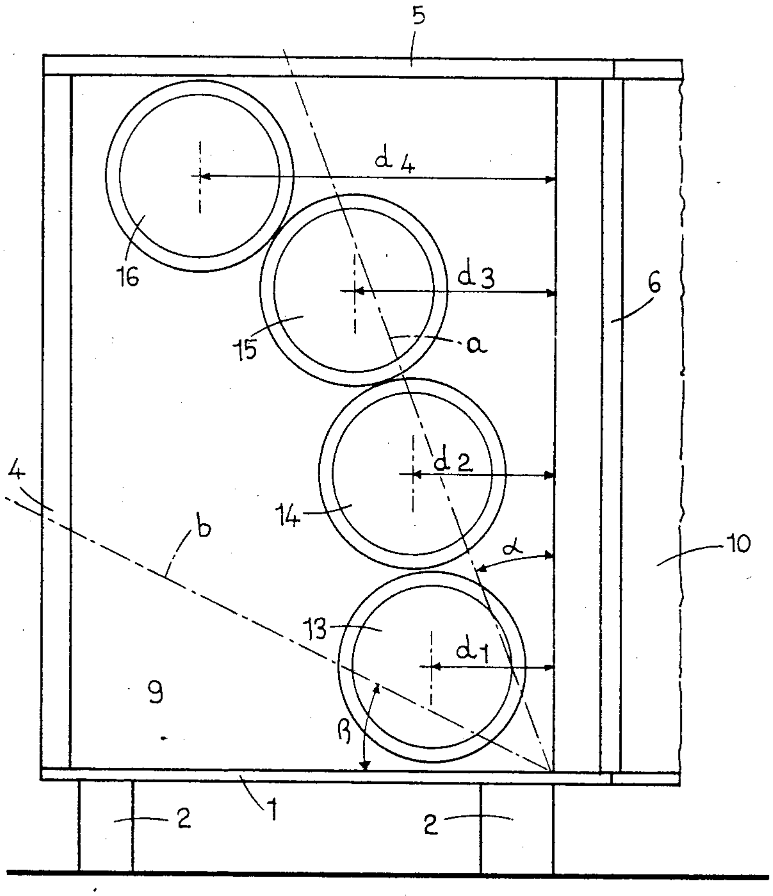
FIG. 3 is a partial view of the baffle along direction A of FIG. 2.

The single stereophonic baffle shown comprises a base plate 1, provided with feet 2, on which are fixed a frontal wall 3 intended to face the person listening and two side walls 4 forming an angle of about 120° with the front wall 3 and having a width comprised between ⅓ and 1/5 that of the frontal wall 3. A panel 5 closes the top of the baffle. This baffle comprises a middle partition 6 extending perpendicularly and rearwardly from the frontal wall dividing the baffle into two chambers 7,8. Each of these chambers 7, 8 is closed towards the back by means of a wall 9, 10 each perpendicular to one of the sides 4 and forming an angle of about 60° with the middle partition 6. These rear walls 9, 10 are used as supports for the loud-speakers which are directed towards the rear of the baffle. A cloth 11, 12 is stretched between the sides 4 and the middle partition 6 and hides the loud-speakers.

In service position, the baffle is placed in front of a wall of the hearing room, the frontal face 3 being parallel to said wall, the rear edge of the middle partition 6 being separated from said wall by a few centimeters or a few tens of centimeters.

The chambers 7, 8 can be at least partially filled with glass wool or other sound insulating material.

Each rear wall 9, 10 serves as support for one of several loud-speakers, from two to five for example, but preferably three or four.

In the example shown, each rear wall 9, 10 has four loud-speakers 13, 14, 15, 16 disposed one above the other and laterally displaced with respect to each other. The distances $d_1$, $d_2$, $d_3$, $d_4$ separating the centers of the loud-speakers 13, 14, 15, 16 from the middle partition 6 increasing from the lower loud-speaker 13 so that the axes of said loud-speaker are located on a line diverging progressively from the middle partition 6, from the lower loud-speaker up to the upper loud-speaker 16. This line passing through the centers of the loud-speakers can be a straight line, a zig-zag line or a curve according to the realisation of the baffle. Preferably, this line connecting the centers of the loud-speaker, is located in a space comprised between two straight lines a, b forming angles $\alpha$, respectively $\beta$ with the middle partition 6, respectively the bottom of the baffle comprised between 15° and 50°.

In general, the greater the distance of the center of a loud-speaker from the bottom 1 of the baffle, the greater the distance d separating this center from the middle partition 6.

In this way, as the rear walls make an angle between them, and with respect to the frontal wall 3, the more a loud-speaker is spaced apart from the middle partition 6, the smaller is the distance $D_1$, $D_2$, $D_3$, $D_4$ with respect to said frontal wall 3. Conversely, the more the distance d of a loud-speaker from the middle partition increases, the greater the distance separating this loud-speaker from the wall of the hearing room increases.

The loud-speakers 13, 14, 15 and 16 are preferably of the same size and can be either identical, or present different frequency responses. In this latter case, the loud-speakers more particularly designed for the restitution of the lower frequencies are placed in the vicinity of the bottom 1 and the middle partition 6, whereas the loud-speakers intended to restituate more particularly the high frequencies are located towards the top of the baffle and far away from the middle partition 6.

In any event, all the loud-speakers mounted on a same rear wall 9, 10 are all fed by the same "right", respectively "left" signal delivered by a stereophonic amplifier, possibly through a filter correcting the frequency response of the loud-speakers.

This baffle permits an acoustic coupling between the chambers 7 and 8 which can be deemed similar to the mechanical coupling existing between the two channels during the recording of a record by means of a needle or sapphire which reads the two "left" and "right" groove and transmits each of them to a transducer but necessarily with a certain mechanical coupling between the two signals.

In this baffle one can modify the value of this acoustic coupling between the two channels either by acting on the elasticity or the rigidity of the middle partition 6 which act as a membrane between the two chambers 7 and 8, or by making one or several holes of appropriate shape and dimensions to make a direct linkage between the chambers 7 and 8.

Thanks to this acoustical coupling between the two channels one obtains a very good stereophonic restitution due to the polarisation of the sounds and to an interaction of the channels which is more effective on the lower loud-speakers near the middle partition than on the upper loud-speakers farther from said partition 6.

The effect of this stereophonic baffle, probably due to a purely reflective hearing as well as to the polarisation of the sounds obtained by the very particular disposition of the loud-speakers, is estonishing; one retrieves always the integral stereophonic effect. It is therefore only necessary to correctly focalize the sound by placing the unit at a distance from the reflecting wall in function of the dimension of the room.

It is also surprising to note that with such a baffle, the position of the listening person in the hearing room has practically no significance, the correct stereophonic restitution of the sound is stable and independent from the hearing position.

When listening to this baffle one remarks further that the sound level does not influence the sound restitution nor the sound presence, this is surprising. Even at low volume, the whole sound image is totally restituted and this is rarely the case with the existing baffles. Finally one remarks also that the impinging of the notes is very clear showing that the problems of displacement of phase are well controlled in this realisation, despite the indirect hearing system.

Figure 4:
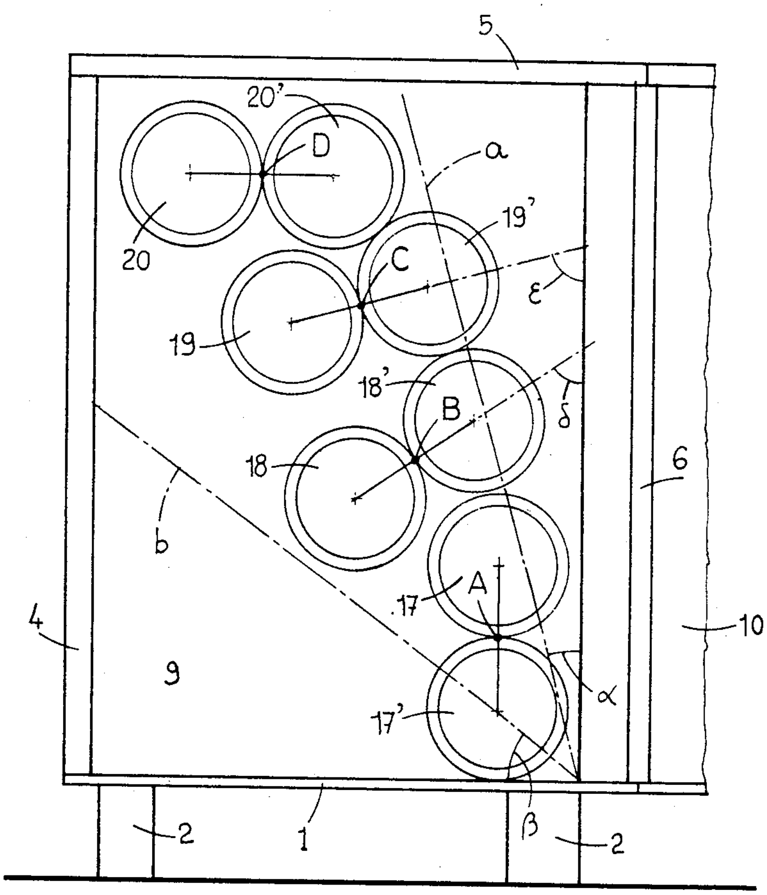
FIG. 4 shows a variant of the baffle.

In a variant of the baffle, it could comprise a greater number of loud-speakers disposed pairwise as shown at FIG. 4, which is a front view of one of the rear walls of this variant.

The loud-speakers 17, 17′ of the first pair, have their axes located on a vertical straight line, i.e. parallel to the middle partition 6.

The loud-speakers 18, 18′ of the second pair are located above the first loud-speakers and further away from the middle partition 6. The axes of the loud-speakers 18, 18′ connected by a straight line forming an angle $\delta$ with the middle partition 6.

The loud-speakers 19, 19′ of the third pair are aligned on a straight line forming an angle $\epsilon$, greater than the angle $\delta$, with the middle partition. These two loud-speakers 19, 19′ are located above the loud-speakers 18, 18′ and the loud-speaker 19 is farther away from the middle partition 6 than the loud-speaker 18, as well as the loud-speaker 19′ being farther away from the partition 6 than the loud-speaker 18′.

Finally, the loudspeakers 20, 20′ of the fourth pair are aligned on a horizontal straight line forming a right angle with the middle partition 6 and the loud-speakers 20, respectively 20′ are more distant from this partition 6 than the loud-speakers 19, respectively 19′.

In this second embodiment, and through analogy with the first embodiment described, it will be noted that the middle point A, B, C, D of segments connecting the centers of the loud-speakers of a same pair are located on a line, straight, broken or curved, which diverges with from the bottom 1 and from the middle partition 6.

Figure 5:
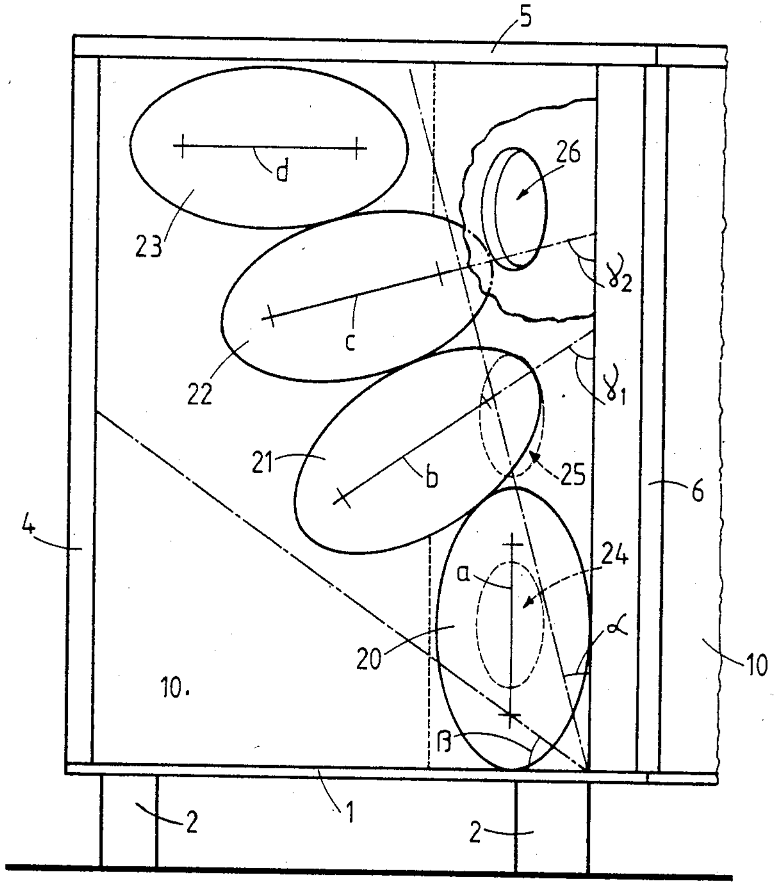
FIG. 5 shows another variant of the baffle.

In a variant shown in FIG. 5, it is possible to use elliptical loud-speakers, in this case each pair of loud-speakers 17, 17′; 18, 18′; 19, 19′ and 20, 20′ would be replaced by an elliptical loud-speaker 21, 22, 23, 24 the major axis a, b, c, d of which would be oriented as the segments connecting the centers of the loud-speakers of a same pair that is, directed vertically for the loud-speaker 20 and horizontally for the loud-speaker 23 and at intermediate angles $\gamma 1$ and $\gamma 2$ for the loud-speakers 21 and 22 relative to the vertical. Here also the center of the elliptical loud-speakers would be located on a line diverging simultaneously from the bottom 1 and the partition 6 of the baffle. As in the previous embodiments, the centers of the loud-speakers of FIG. 5 are located on the rear wall 10 in such a way that the center of a loud-speaker which is closer to the bottom than the center of another loud-speaker is also closer to the ceral partition than said center of said other loud-speaker. Holes 24, 25, 26 are provided in the central partition to link directly the chambers 7 and 8 to realize an accoustic coupling.

In all the cases the centers, or axes of all the loud-speakers are disposed in a space limited between the lines a and b which meet at the intersection of the bottom 1 and the partition 6 and form angles $\alpha$ with the partition 6 respectively $\beta$ with the bottom 1 comprised between 15° and 50°, preferably 30°.

All these variants have the same hearing qualities as the first embodiments.

I claim:

1. Monolithic stereophonic baffle with plain top, bottom, front and side walls and a central partition that divides the baffle into two equal chambers; each of said chambers comprising a rear wall on which a plurality of loud-speakers are mounted all directed to emit sound waves rearwardly; the loud-speakers being symmetrically disposed with respect to the central partition; the location of each loud-speaker of said plurality of loud-speakers on each rear wall being such that any one loud-speaker, the central of which is closer to said bottom wall than the center of any other loud-speaker of said plurality of loud-speakers has its center also closer to the central partition than any other loud-speaker of said plurality of loud-speakers.

2. Baffle as claimed in claim 1, in which an imaginary line on which a center of each load-speaker is situated is a broken line.

3. Baffle as claimed in claim 1, in which an imaginary line on which a center of each loud-speaker is situated is a curve.

4. Baffle according to claim 1, in which all the loud-speakers on one said rear wall are fed by the same "right" signal, and all the loud-speakers on the other said rear wall are fed by the same "left" signal.

5. Baffle as claimed in claim 1, in which the loud-speakers are elliptical, being separated from the bottom wall and the middle partition, the greater being the angle formed by the major axis of the loud-speaker with the middle partition; the major axis of the lowermost loud-speaker being vertical and that of the uppermost loud-speaker being horizontal.

6. Baffle as claimed in claim 1, in which all loud-speakers have the same characteristics.

7. Baffle as claimed in claim 1, in which the loud-speakers having characteristics for the restitution of low frequencies are located in the vicinity of the bottom wall and of the middle partition, whereas the upper loud-speakers are most particularly designed for the restitution of high frequencies.

8. Baffle as claimed in claim 1, in which the rear walls form each an angle of 60° with the middle partition.

9. Baffle as claimed in claim 1, in which the middle partition acoustically couples the two said chambers.

10. Baffle as claimed in claim 9, in which the middle partition comprises openings connecting said two chambers.

11. Baffle as claimed in claim 5, in which all loud-speakers have the same characteristics.

12. Monolithic stereophonic baffle with plain top, bottom, front and side walls and a central partition that divides the baffle into two equal chambers; each of said chambers comprising a rear wall on which a plurality of pairs of contiguous loud-speakers are mounted all directed to emit sound waves rearwardly; said loud-speaker pairs being symmetrically disposed with respect to the central partition; the location of each loud-speaker pair of said plurality of loud-speaker pairs on each rear wall being such that the midpoint of an imaginary line connecting the centers of the loud-speakers of any said pair of loudspeakers which is closer to said bottom wall than said midpoint of any other said loud-speaker of said plurality of loud-speaker pairs has its midpoint also closer to the central partition that any other loud-speaker pair of said plurality of loud-speaker pairs.

* * * * *